(12) United States Patent
Blieske et al.

(10) Patent No.: US 7,368,655 B2
(45) Date of Patent: May 6, 2008

(54) TEXTURED TRANSPARENT PLATE WITH HIGH LIGHT TRANSMISSION

(75) Inventors: Ulf Blieske, Monchengladbach (DE); Thomas Doege, Eschweiler (DE); Marcus Neander, Eschweiler (DE); Aurélia Prat, London (FR); Patrick Gayout, Villemonble (FR)

(73) Assignee: Saint-Gobain Glass France, Courbevoie (FR)

( * ) Notice: Subject to any disclaimer, the term of this patent is extended or adjusted under 35 U.S.C. 154(b) by 256 days.

(21) Appl. No.: 10/496,694

(22) PCT Filed: Nov. 20, 2002

(86) PCT No.: PCT/FR02/03964
§ 371 (c)(1),
(2), (4) Date: Oct. 12, 2004

(87) PCT Pub. No.: WO03/046617
PCT Pub. Date: Jun. 5, 2003

(65) Prior Publication Data
US 2005/0039788 A1    Feb. 24, 2005

(30) Foreign Application Priority Data
Nov. 28, 2001    (FR) ................... 01 15352

(51) Int. Cl.
*H01L 25/00* (2006.01)
(52) U.S. Cl. .................................. 136/246
(58) Field of Classification Search ................ 385/146; 362/600; 136/246, 292, 245; 359/742, 495, 359/569
See application file for complete search history.

(56) References Cited

U.S. PATENT DOCUMENTS

| | | | | |
|---|---|---|---|---|
| 4,249,520 A | * | 2/1981 | Orillion ..................... | 126/651 |
| 5,220,462 A | * | 6/1993 | Feldman, Jr. .............. | 359/855 |
| 5,359,691 A | * | 10/1994 | Tai et al. ................... | 385/146 |
| 5,396,350 A | * | 3/1995 | Beeson et al. ............. | 349/62 |
| 6,177,627 B1 | * | 1/2001 | Murphy et al. ........... | 136/246 |
| 6,275,338 B1 | | 8/2001 | Arai et al. | |
| 6,958,868 B1 | * | 10/2005 | Pender ....................... | 359/742 |

FOREIGN PATENT DOCUMENTS

| | | |
|---|---|---|
| EP | 1 127 984 | 8/2001 |
| GB | 2 066 565 | 7/1981 |
| JP | 7-114025 | 5/1995 |

(Continued)

OTHER PUBLICATIONS

Nikogosyan: "Properties of optical and laser related materials", 1997, Wiley, Chichester XP001040831, pp. 174-175.

(Continued)

*Primary Examiner*—Anabel M Ton
(74) *Attorney, Agent, or Firm*—Oblon, Spivak, McClelland, Maier & Neustadt, P.C.

(57) ABSTRACT

A textured transparent panel placed near an element capable of collecting or emitting light. The panel is textured on at least one of its faces by a plurality of geometrical features in relief, such as pyramids or cones. The panel, which may be made of glass, provides excellent light transmission for all light orientations. The panel may be combined with a photoelectric cell, especially one made of polycrystalline silicon, and may also act as a light diffuser, especially for liquid-crystal screens or plasma lamps.

24 Claims, 3 Drawing Sheets

FOREIGN PATENT DOCUMENTS

| | | |
|---|---|---|
| JP | 08-327807 | 12/1996 |
| WO | 99/56158 | 11/1999 |

OTHER PUBLICATIONS

Letter to European Patent Office regarding corresponding EP 02801070 Application dated Jan. 26, 2007.

European Patent Office Communication dated May 24, 2006 as received in the corresponding EP 02801070 Application.

Letter to European Patent Office regarding corresponding EP 02801070 Application dated Dec. 20, 2005.

European Patent Office Communication dated Jul. 1, 2005 as received in the corresponding EP 02801070 Application.

* cited by examiner

TEXTURED TRANSPARENT PLATE WITH HIGH LIGHT TRANSMISSION

CROSS-REFERENCE TO RELATED DOCUMENTS

The present application is the U.S. counterpart of WO 03/046617, and in turn claims priority to French application number 01/15352 filed on Nov. 28, 2001, the entire contents of each of which are hereby incorporated herein by reference.

The invention relates to the field of transparent antireflection panels capable of trapping light. The transparent panel according to the invention comprises, on at least one of its surfaces, a texturing, that is to say a plurality of geometrical features in relief, these being concave or convex with respect to the general plane of the textured face of the panel. Both sides of the panel may have such features. Thanks to its texturing, the panel has an improved light transmission property. Within the context of the present invention, the term "antireflection" is used to express a reduction in reflection (and not necessarily the complete absence of reflection). The panel according to the invention provides good light transmission whatever the orientation of the incident light.

The panel according to the invention is useful when it is placed in the vicinity of (generally less than 50 cm from) an element capable of collecting or emitting light. In particular when the panel according to the invention is placed above the surface (for example made of silicon) of a photoelectric cell, the panel according to the invention increases the amount of light received by said cell. Although it is conceivable to texture the silicon surface of the photoelectric cell so as to increase its effectiveness, it is still not known how to texture such a surface, in particular when said surface is polycrystalline. The invention, proposing to texture at least one surface of a transparent panel placed above the surface of the cell, therefore provides the only solution for increasing the light flux transmitted onto the cell when the surface of the latter is polycrystalline, and especially made of polycrystalline silicon.

U.S. Pat. No. 4,411,493 teaches a glazing panel for conserving energy and for heating, cooling and illuminating dwellings on the basis of natural light. In that document, the objective is to produce a glazing panel that reflects light in summer and captures as much light as possible in winter. This objective is achieved by linear optical elements extending in a single direction and over the entire length of the glazing panel. In this case, the quality of the light transmission depends strongly on the orientation of the incident light.

U.S. Pat. No. 5,994,641 teaches modules comprising aligned solar cells, said modules possibly including a thermoplastic film having a plurality of parallel V-shaped cavities. These structures are linear and placed between the aligned cells of the same module. The film includes a plurality of V-shaped reliefs defined by a pair of convergent surfaces. The film is coated on the relief side with a light-reflecting metal film.

U.S. Pat. No. 4,918,030 teaches how to form pyramidal features on a single-crystal silicon surface by etching, said surface being intended for the manufacture of photovoltaic cells. These pyramid-shaped features have sides of about 20 μm. These surfaces are more effective for trapping light.

GB 2 066 565 teaches how to form concave regular pyramidal features (inverted pyramids) on the surface of silicon intended for the manufacture of cells for collecting solar energy. The method of preparation includes the formation of a layer (of $SiO_2$) resistant to the enchant for etching the Si, said layer having holes, followed by the etching of the Si, necessarily involving the holes. The surface thus prepared exhibits better light absorption (trapping) and a lower light reflection. This method is complex due to the fact that the silicon is polycrystalline, which makes texturing by etching difficult. This is because the etching is very dependent on the crystalline orientation.

FR 2 551 267 relates to a thin-film photoelectric transducer capable of lengthening the optical path in order to improve its optical absorption property. Its surface is plane on that side on which the light is received and rough on the opposite side. A photoelectric transduction layer (of $SnO_2$) is applied to the rough surface of the substrate (made of glass). The rough relief may be of the "pyramid" type, "in the form of a two-sloped roof" or of the "cone-shaped type". The advantage of this configuration is that it retains less dust, since the external surface is plane. The efficiency of the photoelectric conversion is improved by lengthening the optical path of the incident light. The roughness is achieved by grinding the surface of a glass using a grit (p 12, l 5) followed by etching. The size of the features is about 0.1 μm-1 μm.

The article "*Reduction of reflection losses of PV modules by structured surfaces*", Solar Energy, Vol. 53, No.2, pp. 171-176, 1994 teaches an antireflection glass coating for photoelectric cells. It teaches that the simplest one is a "random" structure, but that such a structure is liable to retain dust. A transparent layer having a V-shaped structure with parallel lines extending over the entire length of the cell is recommended.

French patent application No. 00/08842 teaches the formation by CVD of layers having excroissances such as cones or columns perpendicular to the principal plane of the glass substrate, so as to constitute a hydrophobic/oleophobic surface finish.

FR 2 792 628 teaches a hydrophobic/oleophobic or hydrophilic/oleophilic substrate having a relief comprising a high surface level and a low surface level over a height of 0.01 to 10 μm.

WO 98/23549 teaches a substrate with hydrophilic or hydrophobic properties which comprises, as surface irregularities, protuberances and hollows of submicron size. This surface may be provided with a photocatalytic agent, such as at least partially crystallized titanium oxide (of anatase type).

EP 0 493 202 teaches how to produce diffusing glazing panels by hot rolling, which impresses a relief consisting of hexagonal-based or square-based pyramidal craters. The light transmitted is distributed uniformly so that no structure is visible to the naked eye when the glazing panel is illuminated at a distance of less than 6 m. The features are inscribed within circles having a diameter of between 0.5 and 1.7 mm.

The transparent panel according to the invention comprises, on at least one of its surfaces, a plurality of geometrical features in relief, these being concave and/or convex with respect to the general plane of the textured face of the panel. Both sides of the panel may have such features.

There are two principles whereby the textured transparent panel according to the invention allows the transmission to be increased. Firstly, the reduction in reflection on its textured face is obtained by multiple reflections on the surface, which offer the light a greater opportunity to enter the panel. In addition, the light has smaller angles of incidence on the faces of the features for light rays which would have had high angles of incidence on a plane surface. For example in the case of a pyramid having an apex half-angle of 45°, the rays that would strike a plane surface at an angle of incidence varying between 0 and 90° encounter the surface of the texture with an angle of incidence between −45° and +45°. Since the range of high angles (the closer to 90°) favors reflection, replacing the 0 to 90° range with the −45 to +45° range is accompanied by a substantial reduction in reflection. Secondly, the light reflected after it enters the panel is trapped by reflection on the faces of the features and a larger portion of the light is transmitted through the panel. The reflection losses are thus much smaller.

Figure 1:
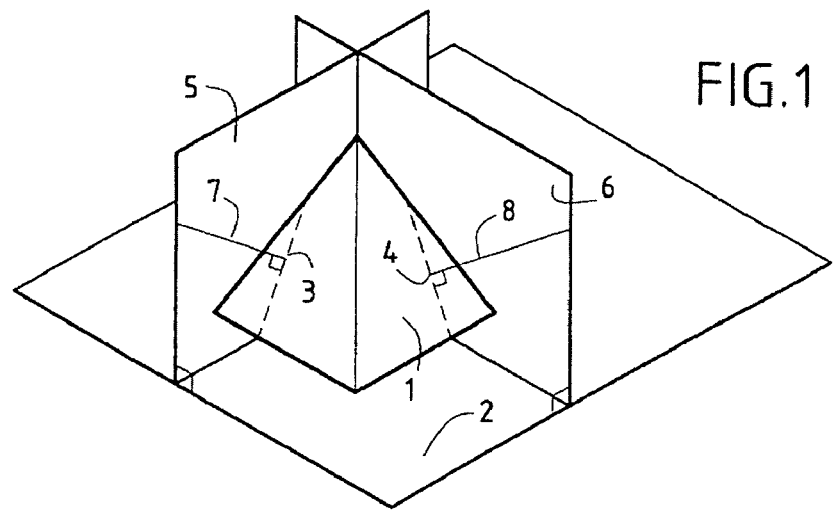
FIG. 1 illustrates a pyramid projecting from the general plane 2 of the textured face of a panel.

The surface of said features has at least two points such that the two planes perpendicular to the general plane of the textured face of the panel, and such that each of them contains one of the two straight lines that are perpendicular to said surface and pass through one of said two points, are not parallel, that is to say they intersect. These two planes may, for example, be mutually perpendicular. Preferably, these two points may both lie on a plane region of the surface of the feature. FIG. 1 illustrates what is meant by these points and planes. This FIG. 1 shows a feature 1 having the shape of a regular square-based pyramid projecting from the general plane 2 of the textured face of the panel. Within the context of the present application, the term "regular pyramid" refers to a pyramid in which all its faces are plane and identical. It may be clearly seen that the pyramid has at least two points 3 and 4 such that the planes 5 and 6, which are perpendicular to the general plane 2 of the textured face of the panel and contain, respectively, the straight lines 7 and 8 normal to the surface of the features at the points 3 and 4, are not parallel. In the case of such a square-based regular pyramid, these two planes 5 and 6 are mutually perpendicular.

Thus, the invention also relates to an assembly comprising a textured transparent panel and an element capable of collecting or emitting light, the distance between said panel and said element being generally at most 5 m, said panel being textured on at least one of its faces by a plurality of geometrical features in relief with respect to the general plane of said face, the textured face being placed on the side on which the light is received (that is to say on the same side as the light source), the surface of said features each having at least two points such that there exists two mutually intersecting planes each containing one of said two points and fulfilling the following two conditions:

a) these planes are both perpendicular to the general plane of the textured face of the panel; and b) these planes each contain one of the two straight lines perpendicular to said surface and passing through one of said two points.

These conditions are necessarily fulfilled in the case of a feature having the shape of a cone or pyramid. These conditions are not fulfilled in the case of the linear V-shaped features of the prior art.

Preferably, the points through which the intersecting planes pass lie on plane surfaces, for example plane faces of a pyramid. A cone does not have a plane surface. In general, the features terminate at a point, as is the case for a cone or pyramid, that is to say that the point on the feature furthest away from the general plane of the panel is the apex of a point.

The surface of said features may have at least three points such that the various planes perpendicular to the general plane of the textured face of the panel, and such that each of them contains one of the three straight lines perpendicular to said surface and passing through one of said three points, are not parallel. Preferably, these three points may both lie on a plane region of the surface of the feature. In particular, this situation occurs if the feature is a regular pyramid whose base (lying in the general plane of the textured face of the panel) is an equilateral triangle.

The features join the general plane of the textured face of the panel via a base, it being possible for said base to be inscribed within a circle whose diameter is generally less than 10 mm, or even less than 7 mm. Preferably, the smallest circle able to contain the base of one of said features has a diameter of at most 5 mm, especially one ranging from 0.001 mm to 5 mm, for example ranging from 1 to 5 mm.

The general plane of the textured face of the panel is the plane containing those points on the textured face which do not form part of the features (the points lying between the features) or those points on the textured face lying on the margin of the features (especially the points where touching features join).

In general, the point on the feature furthest away from the general plane of the textured face of the panel is separated from said plane by a distance ranging from 0.1D to 2D, D representing the diameter of the smallest circle contained in the general plane of the textured face of the panel and able to contain the base of said feature.

The features may, for example, have the shape of a cone or a pyramid having a polygonal base, such as a triangular or square or rectangular or hexagonal or octagonal base, it being possible for said features to be convex, that is to say projecting from the general plane of the textured face of the panel, or to be concave, that is to say forming hollows in the thickness of the panel.

For the case in which the features have the shape of a cone or pyramid, it is preferred that any apex half-angle of said cone or of said pyramid be less than 70° and preferably less than 60°, for example ranging from 25 to 50°. One particularly suitable value is 45°, especially when the textured surface is in contact with air, as this value provides a good combination of the two, "antireflection" and "light trapping", properties.

Figure 2:
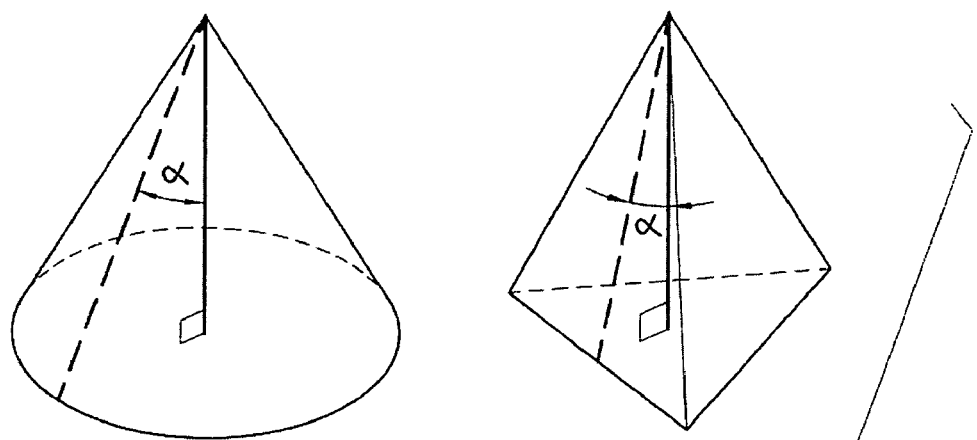
FIG. 2 illustrates pyramids of cone, triangular or squared with the angle of the apex indicated.
Figure 2:
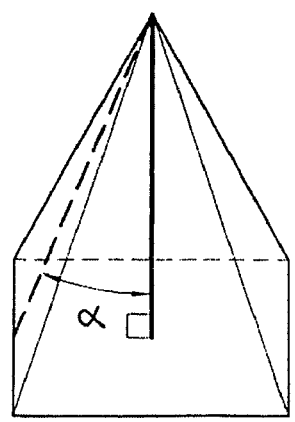

In the case of a cone, the nonzero apex half-angle is the angle between, on one side, the straight line perpendicular to the panel passing through the apex of the cone and, on the other side, the conical surface of the cone. In the case of a pyramid, the nonzero apex half-angle is the angle between, on one side, the straight line perpendicular to the panel passing through the apex of the pyramid and, on the other side, the bisector of the angle at the apex of one of the faces of said pyramid. The apex half-angle α is shown in FIG. 2 in the case of a feature in the form of a cone and of a triangular-based or square-based pyramid. These angle values are valid whether the cone or the pyramid is concave or convex. If the base of the pyramid is a regular polygon (a polygon in which all the sides have the same length), there is only a single apex half-angle. If the base of the pyramid is an irregular polygon, such as a rectangle, there are several apex half-angles, and in this case it is sought for all the apex half-angles to have the values given above.

Preferably, the features are as close as possible to one another and have, for example, their bases separated by less than 1 mm and preferably less than 0.5 mm.

Also preferably, the features are touching. Features are said to be touching when they touch one another at least over part of their surface. Cones may be touching if the circles constituting their bases touch one another. It is preferred that the features be touching as the surface of the panel is thus more textured and the light transmission is improved further. Certain features do not allow a complete join between the features. This is especially the case when the feature is a cone, since even if the circles of the bases of the cones touch one another, there remains a certain area between the circles that does not form part of the features. The term "complete join" is understood to mean the fact that the outline of the base of one feature also forms in its entirety part of the outlines of its neighboring features. Some features may be completely touching so that the entire surface of the panel forms part of at least one feature. In particular, pyramids with a square or rectangular or hexagonal base may be completely touching if they are identical. In the case of square bases (see FIG. 3) or rectangular bases, it is recommended that said bases be aligned so that the features are completely touching. In the case of hexagonal bases, it is recommended that said bases form a honeycomb.

Figure 3:
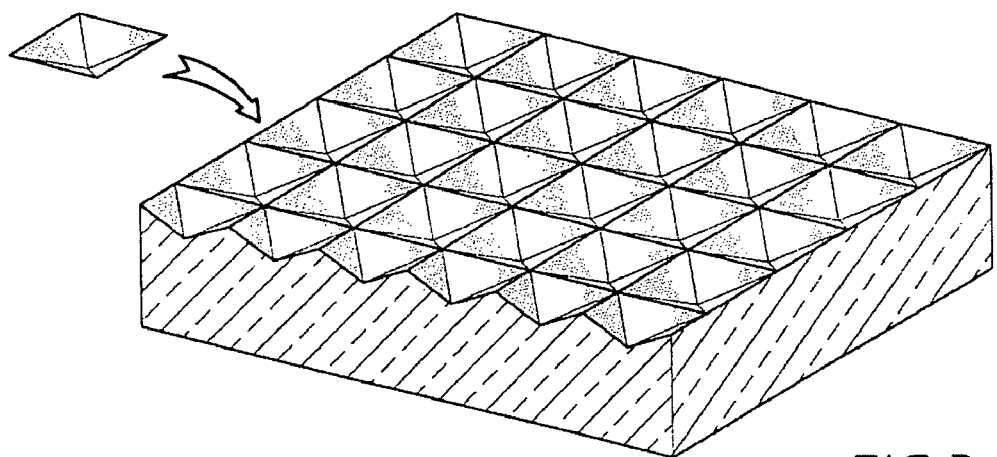
FIG. 3 shows a textured panel having an array of completely touching aligned concave features on its surface.

FIG. 3 shows a textured panel having an array of completely touching aligned concave features on its surface, said features having the shape of square-based pyramids.

Figure 4:
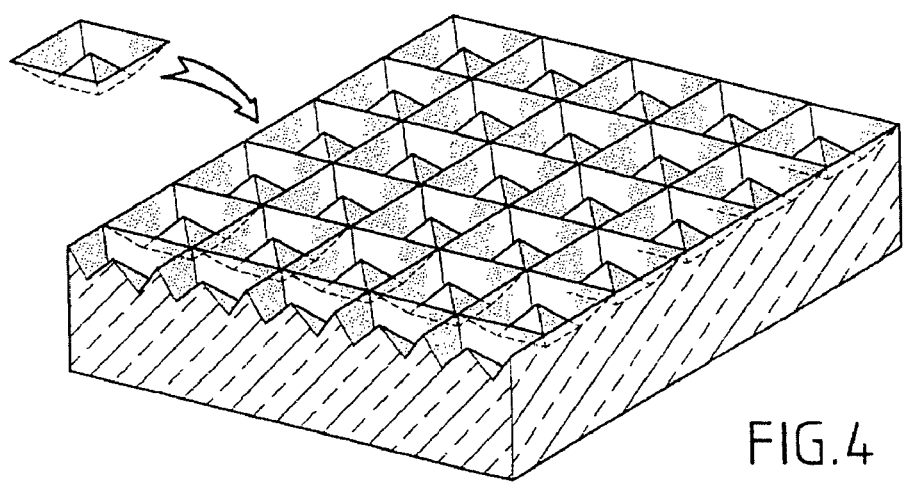
FIG. 4 shows a textured panel having partly concave or convex features on the surface.
Figure 5:
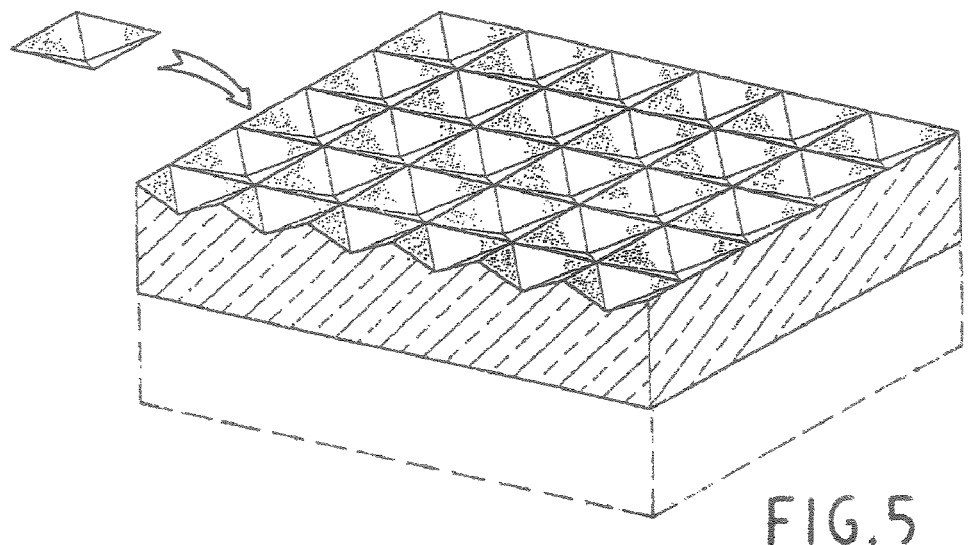
FIG. 5 shows an arrangement of the textured panel of FIG. 3 in association with an element configured to collect light.
Figure 6:
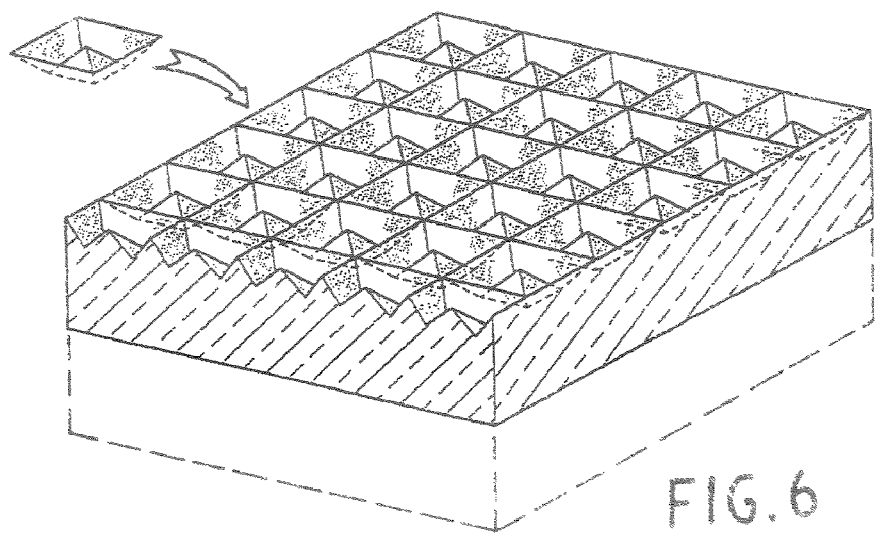
FIG. 6 shows an arrangement of the textured panel of FIG. 4 in association with an element configured to collect light.

The features may be partly concave and partly convex, like the example given in FIG. 4.

The panel may for example be made entirely of glass. It may also be a thermoplastic polymer, such as a polyurethane or a polycarbonate or a polymethyl methacrylate. It may also be made of two materials, for example by combining a glass panel, both surfaces of which are plane and parallel, with a sheet or film of a polymer bearing the features in relief and fastened to said glass panel. In the case of this kind of glass/polymer combination, the polymer may be adhesively bonded to the glass, preferably with an adhesive having a refractive index close to that of the glass and of the polymer, which may especially be between 1.5 and 1.54.

Preferably, most of the mass (that is to say in the case of at least 98% by weight), or even all of the mass, of the panel consists of material(s) having the best possible transparency and preferably having a linear absorption of less than 0.01 $mm^{-1}$ in that part of the spectrum useful for the application, generally the spectrum ranging from 380 to 1200 nm. This is particularly the case when the panel is made of such a material, if necessary provided with one or more thin layers of the diffusing or barrier type at certain wavelengths or thin layers which are antifouling or conducting, these being described in greater detail below. Preferably, this linear absorption is lower the greater the thickness of material, in order to maintain the highest possible light transmission.

When a glass is used in making up the composition of the panel, it is preferred to use an extra-clear glass, that is to say a glass having a linear absorption of less than 0.008 $mm^{-1}$ within the wavelength spectrum ranging from 380 to 1200 nm. Thus, if the panel comprises a glass, this preferably has a linear absorption of less than 0.008 $mm^{-1}$ within the wavelength spectrum ranging from 380 to 1200 nm. Most of the mass of the panel (that is to say at least 98% by weight), or all of the mass, may consist of such a glass. This is especially the case when the panel consists of such a glass, where appropriate provided with one or more thin layers of the diffusing or barrier type at certain wavelengths or thin layers that are antifouling or conducting, these being described in detail below.

The panel according to the invention may have a total thickness ranging from 0.5 to 10 mm. When this is used as a protective panel for a photoelectric cell, the panel preferably has a total thickness ranging from 2 to 6 mm. When it is used as a light diffuser, the panel preferably has a total thickness ranging from 1.5 to 4.5 mm.

The panel according to the invention may be provided with an antireflection coating placed on the side with the textured surface and/or on the side with the untextured surface. Such an antireflection coating may for example be like that described in application PCT/FR01/01735 and obtained in a manner known to those skilled in the art, for example by being deposited on the glass by sputtering, preferably magnetically enhanced sputtering. Preferably, the coating is deposited after the panel has been given its texturing.

There are many applications for the textured panel according to the invention, especially when it is combined with an element capable of collecting or emitting light and placed away from it by at most 5 m, more generally less than 50 cm from it, or even in direct contact with it. At least one textured face of the panel according to the invention is placed on the same side as the light source. Thus, in the assembly according to the invention, the distance between the textured transparent panel and the element capable of collecting or emitting light may also be, depending on the case, less than 15 cm, or less than 3 cm, or ranging from 0 to 10 mm, or ranging from 0 to 5 mm.

When the photoelectric cells are not covered by a transparent panel, they are exposed to various types of attack from their environment (dust, corrosive atmosphere, foul weather, etc.). The panel according to the invention may be directly laid on or fastened to the surface (generally made of single-crystal or polycrystalline silicon or of silicon coated with an antireflection layer such as one made of silicon nitride) of such a cell so as, on the one hand, to protect it from external attack and, on the other hand, to transmit a larger amount of light to the light-collecting surface. In particular, the panel according to the invention may be laid on a photoelectric cell comprising a polycrystalline silicon substrate. The light-collecting surface of the cell may also be textured, for example with concave pyramids, that is to say pyramids forming hollows in the surface of the silicon, especially when it is made of single-crystal silicon. The panel according to the invention may also be fastened to the cell via a layer of an ethylene/vinyl acetate copolymer (EVA) or of polyvinyl butyral (PVB) or of a polyurethane (PU) or of any suitable polymer. The presence of this polymer allows the panel to be fastened to the cell and also excludes air from between the panel and the cell. The surface of the cell may have an antireflection coating, generally made of silicon nitride.

The panel according to the invention may also be placed in the path of the light from a solar collector. The function of a solar collector is to collect light for the purpose of heating. In this case, the element (generally black in color) that collects the light and converts it into heat is placed behind the panel according to the invention with respect to the light path. The distance between the panel and the light-collecting surface may generally be less than 15 cm and is preferably less than 3 cm.

The panel according to the invention may also serve as an optical diffuser with a high light transmission. In this case, the panel according to the invention is placed in front of a light source and its function is to make the luminance uniform. The distance between the light source and the panel according to the invention may, for example, range from 0 to 10 mm, or even from 0 to 5 mm. For this application, it is possible to apply a light-diffusing layer to that face of the panel on the opposite side from the light source. This diffusing layer may, for example, be made of alumina. In this application, the texturing allows the light transmission of the diffuser to be improved, while maintaining, or even improving, its diffusion properties. In particular, the panel according to the invention may be used as a light diffuser when it is placed between the light source for an LCD (liquid crystal display) screen and said LCD screen. The panel according to the invention may also serve as a light diffuser when it is placed in front of a flat plasma discharge lamp. The distance between the panel and the plasma lamp is generally from 0 to 5 mm.

The panel according to the invention may also serve as a screen for a projected image, the observers being on the opposite side from the projector with respect to the panel. In this case too, at least one textured face of the panel is on the same side as the light projector. For this application, it is preferable to apply a light-diffusing layer on the "observers" side of the panel. This diffusing layer may, for example, be made of alumina. In general, the distance between the panel according to the invention and the projector is less than 10 m, and more generally less than 5 m. In this application, the element of the assembly according to the invention is an image projector.

Depending on the intended application, the most appropriate face of the panel may be provided with at least one layer giving the panel a particular property. In particular, a layer forming a barrier at certain wavelengths, for example in the ultraviolet, may be applied. An antifouling layer, such as a layer of TiO2, especially a layer forming the subject matter of patent application EP 1 087 916, or an antifouling layer made of SiO2 or Si oxycarbide or Si oxynitride or Si oxycarbonitride as described in WO 01/32578, may also be applied to the panel, preferably at least on the side directly in the ambient air.

The texturing may be carried out by rolling (or casting), thermoforming or etching, especially laser etching in the case of a polymer material. In the case of texturing a glass surface, the rolling process is particularly suitable. For this process, the texturing is applied to the plane surface of a glass heated to a temperature at which it is possible to deform its surface using a solid object such as a metal roll whose surface has the reverse shape of the texturing to be formed.

Depending on the shape of the intended texturing, this process may not necessarily lead to perfect geometrical shapes. Especially in the case of pyramids, the apex and the edges of the pyramid may be rounded.

In addition to the texturing provided by the features on one side of the panel, texturing provided by a rough layer may be added to the other side of the panel. Such a panel provided with a rough layer is particularly suitable for protecting a photoelectric cell, owing to the fact that said panel transmits light particularly well. In that application, the rough layer is placed on the same side as the photoelectric cell (a synonym for a solar cell). This rough layer may, for example, be a transparent conductive layer based on one or more metal oxides, said layer having an RMS roughness of at least 3 nm, especially at least 5 nm and/or an average size of the features of this roughness of at least 50 nm. This type of conductive layer is known as a TCO (Transparent Conductive Oxide) layer. It is widely used in the field of solar cells and in electronics.

The RMS roughness means the root mean square roughness. This is a measurement made by measuring the value of the root mean square of the roughness. Specifically, this RMS roughness therefore quantifies the mean height of the roughness peaks with respect to a mean height.

The conductive layer has a known chemical nature—it is of the doped metal oxide type. On the other hand, it has the specific aspect of being very rough. Preferably, this roughness is random in the sense that it does not have features of a precise geometry. Furthermore, it is dispersed depending on the area of the surface measured. This particular roughness allows, at the interfaces between the layer and the materials which flank it, increased diffusion of the incident light, which "forces" the latter to have a much longer path through the solar cell. The conductive layer may be deposited by sputtering or by pyrolysis, especially chemical vapor deposition. It may be chosen from doped tin oxide, especially fluorine- or antimony-doped tin oxide, doped zinc oxide, especially aluminum-doped zinc oxide, and doped indium oxide, especially tin-doped indium oxide. Such a layer is particularly suitable when it is deposited on a glass substrate, which means that, in this case, that face of the panel on the opposite side to the face having the texturing according to the invention is a face of a glass substrate. It is possible to place, between the glass substrate and the conductive layer, at least one layer having a barrier function with respect to the species liable to diffuse out of the glass, especially alkali metals, it being possible for the barrier layer to be based on silicon oxide, oxycarbide, oxynitride or nitride, said barrier layer being especially deposited by pyrolysis or by sputtering. The conductive layer generally has a resistance per square of at most 30 or 20 $\Omega/\Box$, especially at most 15 $\Omega/\Box$. The conductive layer generally has a thickness of at most 700 nm, especially at most 650 nm, and preferably between 400 and 600 nm. That face of the glass substrate on which the conductive layer is deposited, directly or indirectly, may have an RMS roughness of at least 1000 nm, especially between 1000 and 5000 nm, and/or a roughness such that the mean size of the features is at least 5 µm, especially between 5 and 100 µm. The roughness of that face of the glass substrate on which the conductive layer is placed, directly or indirectly, may be non-uniform/random. That face of the glass substrate on which the conductive layer is placed, directly or indirectly, may have a roughness causing forward diffusion of the transmitted light, the substrate having in particular an overall light transmission of at least 70 to 75%, including a diffuse light transmission of at least 40 to 45%.

EXAMPLES

A panel according to the invention may be produced from an extra-clear flat glass of the brand name DIAMANT sold by Saint-Gobain Glass, having a linear absorption of less than $8 \times 10^{-3}$ mm$^{-1}$ over the wavelength spectrum ranging from 380 to 1200 nm and a thickness of 4 mm, by producing, on this plate, by rolling at its deformation temperature, a concave texturing composed of an assembly of touching square-based pyramids with the following dimensions: 0.5 mm for each side of the base and an apex half-angle of 45°, the total thickness of the panel remaining 4 mm after texturing. This panel may be fastened by means of a resin to the polycrystalline silicon surface of a photoelectric cell, said surface being coated with a silicon nitride layer 75 nm in thickness. By illuminating the textured surface under the conditions of ASTM standard 892/87 using the AM 1.5 spectrum and by varying the angle of incidence, it is possible to measure the percentage light transmission. The table below gives the results obtained by calculation, especially in comparison with a panel of the same type but not textured (both faces are plane) and with a total thickness equal to that of the textured panel. A 0° angle of incidence corresponds to a direction of the light perpendicular to the general plane of the textured face of the panel.

| Feature | Angle of incidence (°) | | | | | | | | |
| --- | --- | --- | --- | --- | --- | --- | --- | --- | --- |
| | 0 | 10 | 20 | 30 | 40 | 50 | 60 | 70 | 80 |
| No texturing (plane surface) | 85.1 | 85.1 | 85 | 84.9 | 84.5 | 83.3 | 80.6 | 73.6 | 55.15 |
| Presence of pyramids | 90.0 | 91.0 | 91.9 | 89 | 88.5 | 88.2 | 86.2 | 84.1 | 77.0 |

The invention claimed is:

1. An assembly comprising:
a textured transparent panel and an photovltaic cell or solar collector element configured to collect light, a distance between said panel and said element being generally at most 5 m,
said panel being textured on at least one of its faces by a plurality of geometrical features in relief with respect to a general plane of said face, the textured face increasing light transmission of the panel and being placed on a side on which the light is received, a surface of said features each having at least two points such that there exists two mutually intersecting planes each containing one of said two points and fulfilling following two conditions (1)-(2):
(1) the planes are both perpendicular to the general plane of the textured face of the panel; and
(2) the planes each contain one of two straight lines perpendicular to said surface and passing through one of said two points.

2. The assembly as claimed in claim 1, wherein the points are each on a different plane surface.

3. The assembly as claimed in claim 2, wherein the features are pyramids with apex half-angles nonzero.

4. The assembly as claimed in claim 3, wherein a base of the pyramids is polygonal.

5. The assembly as claimed in claim 4, wherein the base of the pyramids is square or rectangular or hexagonal.

6. The assembly as claimed in claim 1, wherein the features are cones having a nonzero apex half-angle.

7. The assembly as claimed in claim 3, wherein any apex half-angle is less than 70°.

8. The assembly as claimed in claim 7, wherein any apex half-angle is less than 60°.

9. The assembly as claimed in claim 8, wherein any apex half-angle ranges from 25° to 50°.

10. The assembly as claimed in claim 1, wherein a smallest circle that may contain a base of the features is inscribed in a circle having a diameter of at most 5 mm.

11. The assembly as claimed in claim 10, wherein the smallest circle that may contain the base of the features is inscribed in a circle having a diameter ranging from 1 to 5 mm.

12. The assembly as claimed in claim 1, wherein a point on a feature furthest away from the general plane of the textured face of the panel is separated from said plane by a distance ranging from 0.1 D to 2D, D representing a diameter of a smallest circle contained in the general plane of the textured face of the panel and able to contain a base of said feature.

13. The assembly as claimed in claim 1, wherein the panel has touching features.

14. The assembly as claimed in claim 1, wherein the panel has completely touching features.

15. The assembly as claimed in claim 1, wherein a bulk of the panel essentially consists of materials whose linear absorption is less than 0.01 mm$^{-1}$ within the spectrum ranging from 380 to 1200 nm.

16. The assembly as claimed in claim 15, wherein the bulk of the panel essentially consists of a glass having a linear absorption of less than 0.008 mm$^{-1}$ within the spectrum ranging from 380 to 1200 nm.

17. The assembly as claimed in claim 1, wherein the distance between the panel and the element is less than 15 cm.

18. The assembly as claimed in claim 17, wherein the distance between the panel and the element is less than 3 cm.

19. The assembly as claimed in claim 18, wherein the distance between the panel and the element ranges from 0 to 10 mm.

20. The assembly as claimed in claim 19, wherein the distance between the panel and the element ranges from 0 to 5 mm.

21. The assembly as claimed in claim 1, wherein the element is a photoelectric cell.

22. The assembly as claimed in claim 21, wherein the photoelectric cell has a polycrystalline silicon substrate.

23. The assembly as claimed in claim 1, wherein the element is an image projector.

24. The assembly as claimed in claim 1, wherein the assembly is a solar collector.

* * * * *

UNITED STATES PATENT AND TRADEMARK OFFICE
CERTIFICATE OF CORRECTION

| | | |
|---|---|---|
| PATENT NO. | : 7,368,655 B2 | Page 1 of 1 |
| APPLICATION NO. | : 10/496694 | |
| DATED | : May 6, 2008 | |
| INVENTOR(S) | : Blieske et al. | |

It is certified that error appears in the above-identified patent and that said Letters Patent is hereby corrected as shown below:

On the title page, Item (75), the Inventors' information is incorrect. Item (75) should read:

Item -- (75) Inventors: Ulf Blieske, Monchengladbach (DE); Thomas Doege, Eschweiler (DE); Marcus Neander, Eschweiler (DE); Aurélia Prat, London (GB); Patrick Gayout, Villemonble (FR) --

Signed and Sealed this

Twenty-second Day of July, 2008

JON W. DUDAS
*Director of the United States Patent and Trademark Office*